(12) United States Patent
Frohberg et al.

(10) Patent No.: US 8,349,744 B2
(45) Date of Patent: Jan. 8, 2013

(54) DOUBLE DEPOSITION OF A STRESS-INDUCING LAYER IN AN INTERLAYER DIELECTRIC WITH INTERMEDIATE STRESS RELAXATION IN A SEMICONDUCTOR DEVICE

(75) Inventors: Kai Frohberg, Niederau (DE); Uwe Griebenow, Markkleeberg (DE); Katrin Reiche, Goltzscha (DE); Heike Berthold, Hirschfeld (DE)

(73) Assignee: Advanced Micro Devices, Inc., Austin, TX (US)

( * ) Notice: Subject to any disclaimer, the term of this patent is extended or adjusted under 35 U.S.C. 154(b) by 565 days.

(21) Appl. No.: 12/272,273

(22) Filed: Nov. 17, 2008

(65) Prior Publication Data

US 2009/0243049 A1    Oct. 1, 2009

(30) Foreign Application Priority Data

Mar. 31, 2008  (DE) ................. 10 2008 016 438

(51) Int. Cl.
 *H01L 21/31* (2006.01)
(52) U.S. Cl. ..................... 438/783; 257/369
(58) Field of Classification Search .......... 257/369; 438/783
 See application file for complete search history.

(56) References Cited

U.S. PATENT DOCUMENTS

| 2004/0029323 | A1* | 2/2004 | Shimizu et al. | 438/142 |
| 2006/0046400 | A1* | 3/2006 | Burbach et al. | 438/282 |
| 2006/0286758 | A1 | 12/2006 | Liang et al. | 438/305 |
| 2007/0018203 | A1* | 1/2007 | Atanackovic et al. | 257/254 |

FOREIGN PATENT DOCUMENTS

| DE | 102004026149 A1 | 12/2005 |
| DE | 102004042167 A1 | 3/2006 |
| DE | 102005057073 A1 | 5/2007 |
| DE | 102007041210 A1 | 3/2009 |

OTHER PUBLICATIONS

Translation of Official Communication from German Patent Office for German Patent Application No. 10 2008 016 438.0-33 dated Nov. 25, 2008.
Translation of Official Communication from German Patent Office for German Patent Application No. 10 2008 016 438.0 dated Apr. 16, 2009.

* cited by examiner

*Primary Examiner* — N Drew Richards
*Assistant Examiner* — Yu-Hsi D Sun
(74) *Attorney, Agent, or Firm* — Williams, Morgan & Amerson, PC

(57) ABSTRACT

Enhanced efficiency of a stress relaxation implantation process may be achieved by depositing a first layer of reduced thickness and relaxing the same at certain device regions, thereby obtaining an enhanced amount of substantially relaxed dielectric material in close proximity to the transistor under consideration, wherein a desired high amount of stressed dielectric material may be obtained above other transistors by performing a further deposition process. Hence, the negative effect of the highly stressed dielectric material for specific transistors, for instance in densely packed device regions, may be significantly reduced by depositing the highly stressed dielectric material in two steps with an intermediate relaxation implantation process.

13 Claims, 5 Drawing Sheets

DOUBLE DEPOSITION OF A STRESS-INDUCING LAYER IN AN INTERLAYER DIELECTRIC WITH INTERMEDIATE STRESS RELAXATION IN A SEMICONDUCTOR DEVICE

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors used for generating a strain in channel regions of the transistors.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor or positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

The deposition parameters used for forming one or both types of highly stressed dielectric layers may also have an influence on the deposition behavior, for instance with respect to the gap filling capabilities of the PECVD process. For example, when forming stressed dielectric layers comprising a high compressive or tensile stress level above transistor elements formed on the basis of design rules requiring a gate length of 50 nm and less, the limited conformal deposition capabilities of the deposition process may result in less pronounced overall device performance, in particular when semiconductor devices are considered that include densely packed device areas, such as memory areas of complex central processing units (CPUs). That is, in many semiconductor devices, a respective balance between design-related performance characteristics, such as the overall transistor architecture, the transistor width and the like, may be implemented, wherein efficient strain-inducing mechanisms may also play an important role. For example, as previously explained, in particular, relatively high compressive stress levels may be created in a silicon nitride material, thereby offering the potential for significantly enhancing performance of P-channel transistors for a standard crystallographic configuration of the silicon layer. Since typically the overall charge carrier mobility of P-channel transistors may be less compared to the charge carrier mobility of N-channel transistors, the respective imbalance in drive current capability may be taken into consideration by other design measures, such as adapting transistor width of P-channel transistors and the like. By providing a highly stressed dielectric material, however, respective design measures may be required to a significantly lesser degree, thereby enhancing overall design flexibility and providing the potential for further increasing the overall packing density of the semiconductor device. In order to create a highly efficient strain-inducing mechanism, the highly stressed dielectric material may be formed above the transistors, substantially without requiring additional process steps, as may typically be required for sophisticated dual stress liner approaches in which stressed dielectric materials of different internal stress types may be positioned individually above respective transistor types. Consequently, this process technology may be an attractive approach for substantially enhancing the overall device performance without the additional process complexity. However, it turns out that a corresponding gain in overall device performance may be less pronounced as expected, as will be described in more detail with reference to FIGS. 1a-1b.

FIG. 1a schematically illustrates a cross-sectional view of a semiconductor device 100 comprising a substrate 101, above which is formed a semiconductor layer 102. The substrate 101 may represent any appropriate carrier material for forming thereabove the semiconductor layer 102, which is typically a silicon layer, which may include other components such as germanium, carbon and the like. The semiconductor layer 102 may represent an upper portion of the substrate 101 thereby providing a bulk configuration, while, in other cases, a buried insulating layer (not shown) may be located between the substrate 101 and the semiconductor layer 102, thereby defining a silicon-on-insulator (SOI) configuration.

The semiconductor device 100 further comprises one or more first transistors 150A, which are assumed to be P-channel transistors, the performance of which is to be enhanced by providing a highly stressed dielectric material, as discussed above. Furthermore, one or more second transistors 150B may be formed in and above the semiconductor layer 102, wherein, in the example shown, the one or more second transistors 150B may represent transistors in which compressive stress may negatively affect the overall performance, while a moderately densely packed device geometry may also be realized by the transistors 150B. That is, a distance between neighboring transistor elements 150B may be comparable to the transistor dimensions in the transistor length direction, which is represented by the horizontal direction in FIG. 1a. For example, the plurality of second transistors 150B may be provided in a memory area of the semiconductor device 100.

The transistors 150A, 150B typically comprise a gate electrode structure 153, which may comprise gate electrode material 153A, possibly in combination with a metal silicide region 153C, if the gate electrode material 153A may initially be comprised of polysilicon. Furthermore, the gate electrode structure 153 comprises a gate insulation layer 153B, which separates the gate electrode material 153A from a channel region 152, which is defined in the semiconductor layer 102. The channel region 152 is laterally enclosed by drain and source regions 151 having an appropriate dopant profile in the lateral and vertical direction, as required by the overall transistor configuration. It should be appreciated that, although the transistors 150A, 150B are illustrated so as to have basically the same configuration, these transistors may differ from each other, for instance, with respect to the thickness and/or composition of the gate insulation layers 153B, the gate length, i.e., in FIG. 1a the horizontal extension of the gate electrode material 153A, the conductivity type and thus the dopant species used for defining the drain and source regions 151, the respective vertical and lateral distribution of the dopant species in the drain and source regions 151 and the like.

Furthermore, as shown, a sidewall spacer structure 154 may be provided at sidewalls of the gate electrode structure 153. Moreover, the conductivity of the drain and source regions 151 may be increased by providing a metal silicide region 151A therein. Moreover, a compressively stressed contact etch stop layer 110 is formed above the first and second transistors 150A, 150B with an appropriate thickness so as to provide a desired high strain level in the channel region 152 of the transistor 150A and also comply with the deposition capabilities of the respective PECVD technique in order to not unduly create deposition-related non-uniformities at and above the transistors 150B, in particular in densely packed device regions, as shown. The stressed contact etch stop layer 110 may be comprised of silicon nitride and the like.

The semiconductor device 100 as shown in FIG. 1a may be formed on the basis of well-established process techniques in which the transistors 150A, 150B may be formed by providing appropriate materials for the gate insulation layer 153B and the gate electrode 153A. For this purpose, oxidation and/or deposition recipes may be used for the gate dielectric material followed by the deposition of an appropriate gate electrode material, such as polysilicon. Thereafter, sophisticated patterning strategies may be used to obtain the gate electrode structure 153 with a desired gate length. Thereafter, the drain and source regions 151 may be defined on the basis of complex implantation sequences, or, additionally, the spacer structure 154 may act as an implantation mask wherein the overall width of the spacer structure 154 may be modified during the respective implantation sequence so as to obtain the desired lateral shielding effect. Next, the metal silicide regions 151A, 153C may be formed, for instance, in a common manufacturing sequence, followed by the deposition of the contact etch stop layer 110 on the basis of appropriately selected deposition parameters in order to obtain the desired high internal stress level, which is assumed to be a compressive stress level for enhancing performance of the P-channel transistor 150A. For sophisticated devices, a thickness of the contact etch stop layer 110 may be in the range of approximately 120-150 nm in order to avoid deposition-related irregularities at the transistors 150B. That is, typically, the thickness of the layer 110 is a compromise between a substantially void-free deposition above the densely packed device region as represented by the second transistors 150B and the requirement for a high strain in the channel region 152 of the transistor 150A, which may involve the deposition of a high amount of stressed dielectric material and thus of a moderately great thickness of the layer 110.

As previously discussed, the required performance of the transistors 150B may be obtained by design-specific criteria, while the strain-inducing mechanism provided by the layer 110 for the first transistor 150A may be required so as to provide the specified overall performance of the device 100. In the embodiment shown, the dielectric layer 110 may be directly deposited on the metal silicide regions 151A, thereby providing a highly efficient strain-inducing mechanism wherein, however, a respective compressive strain may also be created in the transistors 150B, thereby reducing the performance thereof. Consequently, a respective stress relaxation is performed for the second transistors 150B on the basis of an ion implantation process.

FIG. 1b schematically illustrates the semiconductor device 100 during a respective ion implantation process 104, which may be performed on the basis of an implantation mask 105 that covers the first transistor 150A while exposing the second transistors 150B. During the ion implantation process 104, an appropriate species, such as germanium, silicon and the like, may be used for bombarding the exposed portion of the layer 110, thereby modifying the molecular structure and hence relaxing the internal stress level. However, in particular in densely packed device regions as shown, the local thickness of the layer 110 may vary significantly so that, for a specified implantation energy and dose, respective varying degrees of relaxation may be created, which may finally result in substantially relaxed portions 110A, typically in the upper portion of the layer 110, and in substantially non-relaxed portions 110B, which may thus exert a significant stress on the transistors 150B, thereby creating non-desired compressive strain in the channel regions 152. However, a respective adaptation of the ion implantation parameters may be difficult to be achieved since an increase of implantation energy, possibly in combination with an increased dose, may finally result in a significant modification of respective transistor areas, such as the metal silicide regions 153C, 151A, and gate electrode 153A and the like.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and techniques for forming the same in which the relaxation of a stressed dielectric material formed above the basic transistor structure may be enhanced by providing a first portion of the dielectric material with a reduced thickness, which may result in a reduced degree of thickness variation, in particular at densely packed device regions. Consequently, a subsequent stress relaxation implantation process may be performed on the basis of less pronounced thickness variations, thereby enabling an improved adaptation of the implantation parameters with respect to the penetration depth of the implant species for obtaining an enhanced degree of relaxation in the vicinity of the channel region of the transistors. Thereafter, a further portion of the dielectric material may be deposited, thereby providing a desired high amount of stressed dielectric material above one type of transistor, while the previously relaxed portion of the dielectric material may act as an efficient buffer material, wherein, in some illustrative embodiments, an additional relaxation implantation process may be performed to further reduce the overall stress level of dielectric material formed above the transistors, in which a corresponding stress may be considered inappropriate.

One illustrative method disclosed herein comprises forming a first stress-inducing layer above a first transistor and a second transistor, which are formed above a substrate, wherein the first stress-inducing layer generates a first type of stress. The method further comprises reducing a magnitude of the first type of stress of the first stress-inducing layer above the second transistor. Finally, the method comprises, after reducing the magnitude of the first type of stress of the first stress-inducing layer, forming a second stress-inducing layer above the first and second transistors, wherein the second stress-inducing layer generates the first type of stress.

Another illustrative method disclosed herein comprises forming a first stress-inducing layer above a first transistor and a second transistor and selectively relaxing an internal stress of the first stress-inducing layer above the second transistor. The method further comprises, after the selective relaxation of the internal stress of the first stress-inducing layer, forming a second stress-inducing layer above the first and second transistors. Finally, an interlayer dielectric material is formed on the second stress-inducing layer.

One illustrative semiconductor device disclosed herein comprises a first dielectric layer formed above a first transistor and a second transistor, wherein the first dielectric layer has a stress-inducing portion above the first transistor and a substantially relaxed portion above the second transistor, wherein the stress-inducing portion induces a first type of strain in a channel region of the first transistor. The semiconductor device further comprises a second dielectric layer formed on the first dielectric layer, which has a stress-inducing portion formed at least above a first transistor, wherein the stress-inducing portion of the second dielectric layer induces the first type of strain in the channel region of the first transistor.

BRIEF DESCRIPTION OF THE DRAWINGS

The disclosure may be understood by reference to the following description taken in conjunction with the accompanying drawings, in which like reference numerals identify like elements, and in which.

Figure 1A:
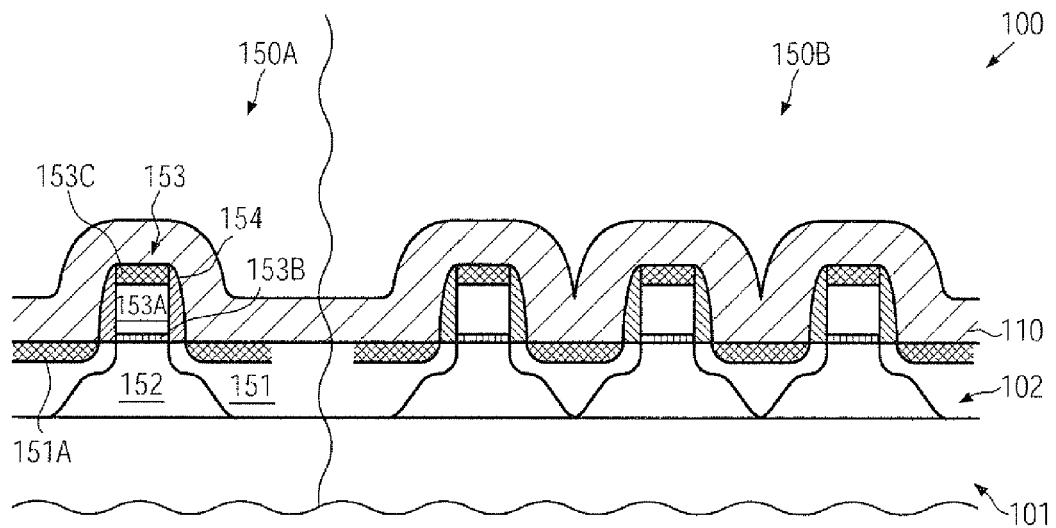
FIGS. 1a-1b schematically illustrate a conventional semiconductor device during various manufacturing stages in forming a highly stressed dielectric layer above the basic transistor structures, wherein the internal stress level is to be relaxed above a densely packed device region, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the subject matter disclosed herein relates to an enhanced process technique and respective semiconductor devices in which performance of one type of transistor may be enhanced on the basis of an efficient overall manufacturing process flow while maintaining a negative influence on other transistors at a low level. For this purpose, the efficiency of a stress relaxation implantation process may be enhanced by depositing dielectric material in two or more deposition steps of reduced thickness and performing at least one relaxation implantation process after the first deposition step, thereby providing enhanced process conditions in terms of more efficiently relaxing material portions that are in close proximity to the channel region of the underlying transistor structure. Consequently, in particular in densely packed device regions, the pronounced thickness variations may be significantly "reduced" by depositing the dielectric material with a significantly reduced thickness at the first deposition step so that the subsequent relaxation implantation may result in enhanced relaxation while also improving overall process controllability. Thus, an efficient buffer layer may be provided by the substantially relaxed portion and may also significantly reduce a stress component of dielectric material, which may be deposited in a subsequent deposition step. In some illustrative embodiments, therefore, an interlayer dielectric material may be formed directly on the stressed dielectric material formed in the second deposition step without requiring an additional relaxation of the second dielectric layer, while nevertheless providing a significantly enhanced overall device performance compared to conventional strategies, as previously explained with reference to FIGS. 1a-1b. In other cases, a further relaxation implantation process may be performed after the second deposition process, thereby even further reducing the overall intrinsic stress level of the dielectric material positioned above the transistor structure under consideration. Moreover, in other illustrative embodiments disclosed herein, the relaxation implantation process may be performed on the basis of a tilt angle, thereby even further enhancing the relaxing effect of the implantation process, even in densely packed device regions.

As a consequence, a highly efficient overall manufacturing flow may be established by, for instance, directly forming a first dielectric material on the basic transistor structures with a reduced thickness and performing an efficient relaxation implantation process for one type of transistor, while a desired high stress level may be obtained in the other type of transistor by performing at least one further deposition step. Thus, compared to conventional strategies, the overall cycle time of the products may be substantially maintained, while nevertheless providing enhanced overall device characteristics.

Figure 2A:
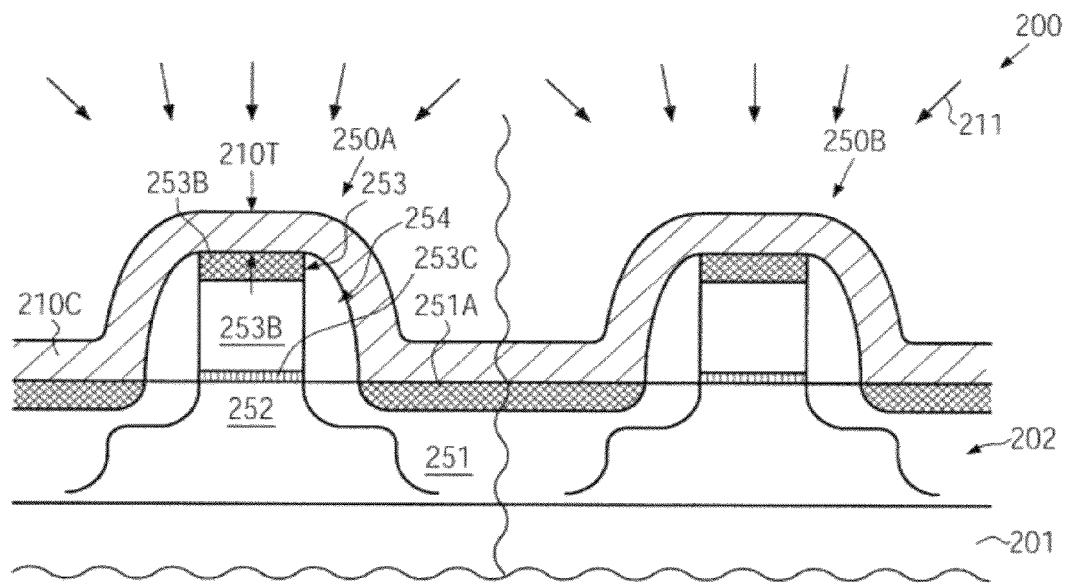
FIGS. 2a-2d schematically illustrate cross-sectional views of a semiconductor device during various manufacturing stages wherein a stressed dielectric material is formed above one type of transistor on the basis of a two-step deposition process, wherein, after the first step, a stress relaxation implantation process may be performed above specific transistors, according to illustrative embodiments.

FIG. 2a schematically illustrates a cross-sectional view of a semiconductor device 200 comprising a substrate 201, above which may be formed a semiconductor layer 202. As previously discussed with reference to the device 100, the substrate 201 and the semiconductor layer 202 may have any appropriate configuration so as to enable the fabrication of respective transistors 250A, 250B. For example, the substrate 201 and the layer 202 may, in addition to the above-described SOI configuration and bulk configuration, also comprise a hybrid structure, that is, portions of the transistors 250A, 250B may be provided on the basis of a bulk configuration while other transistors may have an SOI architecture, depending on the overall device requirements. In the embodiment shown, it may be assumed that the first transistor 250A may require an enhancement of charge carrier mobility by providing a stressed dielectric material, while the transistor 250B may not require a corresponding externally applied stress, for instance, since generally an increased stress level may have a negative influence on the overall performance, for instance the presence of a respective stress may reduce a charge carrier mobility, or moderately high stress levels may generally negatively affect performance of the devices, for instance, in densely packed memory areas and the like. As previously discussed, although the transistors 250A, 250B are illustrated so as to have substantially the same basic configuration, the transistors 250A, 250B may differ in one or more components, such as dimension, type of dopant species and the like. The transistors 250A, 250B may each comprise a gate electrode structure 253, which may include, depending on the overall configuration, a gate electrode material 253A, which may be comprised of polysilicon or any other metal-containing material and the like. Furthermore, a metal silicide region 253B may be provided on top of the gate electrode 253A if a silicon-containing material is provided in the gate electrodes 253A. Furthermore, the gate electrode structure 253 may comprise a gate insulation layer 253C, separating the gate electrode material 253A from a channel region 252, which in turn is laterally enclosed by drain and source regions 251 having the appropriate vertical and lateral dopant profile, as is also explained with reference to the device 100. The gate insulation layer 253C may be comprised of any appropriate material such as silicon dioxide, silicon nitride, silicon oxynitride, a high-k dielectric material, which is to be understood as a dielectric material having a dielectric constant of approximately 10.0 or higher, and the like. Furthermore, depending on the overall device and process requirements, a spacer structure 254 may be provided at sidewalls of the gate electrode structure 253. It should be appreciated that the sidewall spacer structure 254, or at least a portion thereof, may have been removed in an earlier manufacturing stage, for instance with respect to reducing a distance of a highly stressed dielectric material from the channel region 252.

Furthermore, in the embodiment shown, a first dielectric layer 210C is formed above the first and second transistors 250A, 250B and has an internal stress level so as to create a desired type of strain in the channel region 252 of the transistor 250A, and, in the manufacturing stage shown in FIG. 2a, also in the second transistor 250B, in which the corresponding strain may not be desired. The first dielectric layer 210C may be comprised of silicon nitride, nitrogen-containing silicon carbide, silicon dioxide, etc., when moderately high levels of compressive stress are desired. In other illustrative embodiments, a high internal tensile stress level may be obtained on the basis of a silicon nitride material, as previously explained. The first dielectric layer 210C may be provided with an appropriate thickness 210T that provides an appropriate deposition behavior without creating significant thickness variations, even if sophisticated surface topographies are considered, as, for instance, in densely packed device regions, as will be described later on in more detail. Thus, the thickness 210T may be selected so as to respect the overall gap filling capabilities of the deposition process under consideration in order to obtain a substantially conformal deposition behavior, which may also provide enhanced surface conditions during a subsequent relaxation implantation process. For example, in some illustrative embodiments, the thickness 210T is selected to be approximately 50 nm and less, wherein, for instance, a gate length of the gate electrode structures 253 may be approximately 50 nm and less. It should be appreciated, however, that a higher layer thickness may be used when the overall surface topography and the gap filling capability may provide a substantially conformal deposition result for the layer 210C, even in densely packed device regions.

The semiconductor device 200 as shown in FIG. 2a may be formed on the basis of the following processes. After the definition of any isolation structures (not shown), a basic dopant profile may be established in the semiconductor layer 202, followed by a patterning sequence for forming the gate electrode structures 253. For this purpose, similar process techniques may be used, as previously described with reference to the device 100, wherein appropriate techniques may also be used for providing gate dielectric materials for the gate insulation layer 253C, possibly in combination with metal-containing gate electrode materials and the like. Thereafter, the drain and source regions 251 may be formed on the basis of the sidewall spacer structure 254, which may be appropriately adapted in width so as to obtain the desired lateral and vertical concentration profile. As previously indicated, the spacer structure 254, or at least a portion thereof, may be removed prior to or after the formation of the metal silicide regions 251A, wherein, in some cases, the metal silicide region 253B of the gate electrode structure may also be removed. Next, the first dielectric layer 210C may be deposited upon appropriately selected deposition parameters, which provide a desired high internal stress level, while the reduced thickness 210T may provide reduced thickness variations, irrespective of the underlying surface topography. In one illustrative embodiment, the layer 210C may be directly formed on the first and second transistors 250A, 250B, that is, the dielectric layer 210C may be provided in the form of a substantially homogenous layer material that is in contact with the surface of the drain and source regions 251, for instance with the metal silicide regions 251A. In this case, a highly efficient strain transfer mechanism may be accomplished since any intermediate substantially non-stressed material may be avoided, except for the remaining portion of the spacer structure 254. In other cases, when a direct contact of the material 210C with metal silicide regions 251A or other exposed portions of the drain and source areas 251 may not be desired, a liner material (not shown) may be formed prior to the deposition of the dielectric layer 210C.

Figure 2B:
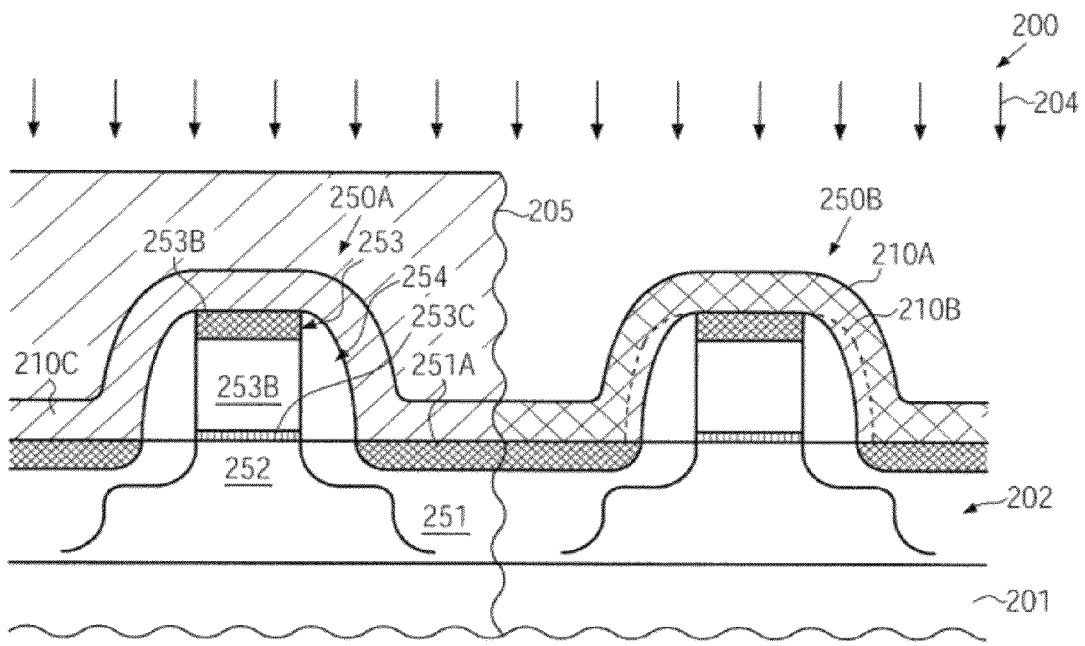

FIG. 2b schematically illustrates the semiconductor device 200 during a relaxation implantation process 204, which may be performed on the basis of an appropriate implantation mask 205, for instance a resist mask, which may cover the first transistor 250A. Hence, the selection of appropriate implantation parameters may be less critical since a reduced thickness variation, in particular above horizontal portions of the semiconductor layer 202, may be accomplished during the previous deposition of the layer 210C, thereby enabling the selection of appropriate implantation energy and dose values so as to substantially relax the layer 210C across the entire thickness thereof, at least at substantially horizontal portions, without significantly affecting the overall characteristics of the transistor 250B. For example, appropriate implantation parameters, such as dose and energy, may be determined on the basis of well-established simulation models and experiments, in which the penetration depth, the relaxing effect and the like may be studied with respect to the material characteristics of the layer 210C. For example, in some illustrative embodiments, the implantation process 204 may be performed on the basis of xenon ions which may provide a high stress relaxing effect at moderately low dose values due to the increased mass of the xenon ions, possibly a double ionized state thereof. Consequently, a substantially relaxed portion 210A may be formed above the transistor 250B so that a non-desired effect of the initial high internal stress level of the layer 210C as deposited may be significantly reduced in the transistor 250B, in particular, since the stress relaxation may be effected in close proximity to the drain and source regions 251, contrary to conventional approaches, as described with reference to the device 100. Thus, respective non-relaxed portions 210B, in which a significant degree of internal stress may still prevail, may be restricted to less critical areas, such as substantially vertical areas of the layer 210C, which may have a less pronounced effect on the overall strain-inducing mechanism. As will be described later on in more detail, the portions 210B may also be significantly reduced on the basis of the techniques disclosed herein.

Figure 2C:
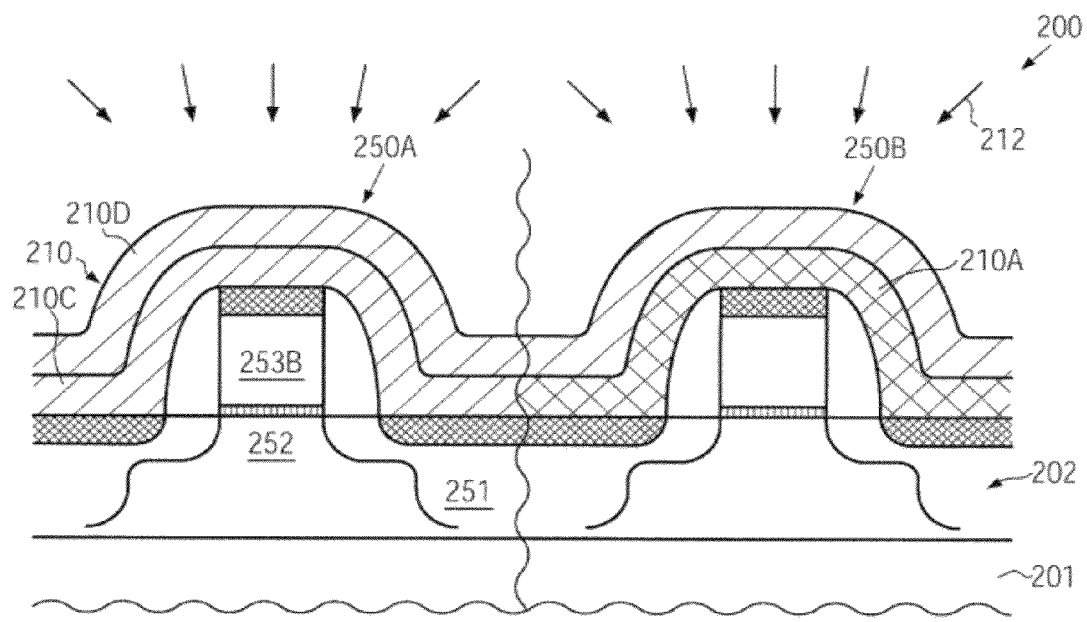

FIG. 2c schematically illustrates the semiconductor device 200 in a further advanced manufacturing stage. As illustrated, a second dielectric layer 210D is formed on the first dielectric layer 210C and may have a similar high internal stress level so as to further increase the strain in the transistor 250A. In the embodiment shown, the first and second dielectric layers 210C, 210D may commonly define a dielectric layer 210 corresponding to the layer 110 in the conventional approach, thereby providing a desired amount of highly stressed dielectric material in close proximity to the channel region 252 of the transistor 250A. However, due to the substantially relaxed portion 210A formed above the transistor 250B, the effect of the layer 210D on the second transistor 250B may be significantly reduced since the relaxed portion 210A may act as a buffer material, thereby efficiently compensating for a significant amount of the stress of the layer 210D. Thus, compared to conventional approaches, the stress conditions above the second transistor 250B may be substantially "inverted" since, now, a substantially stress-neutral material, i.e., the substantially relaxed portion 210A, is formed immediately adjacent to the basic transistor structure, while the highly stressed portion 210D is offset by means of the portion 210A.

Figure 1B:
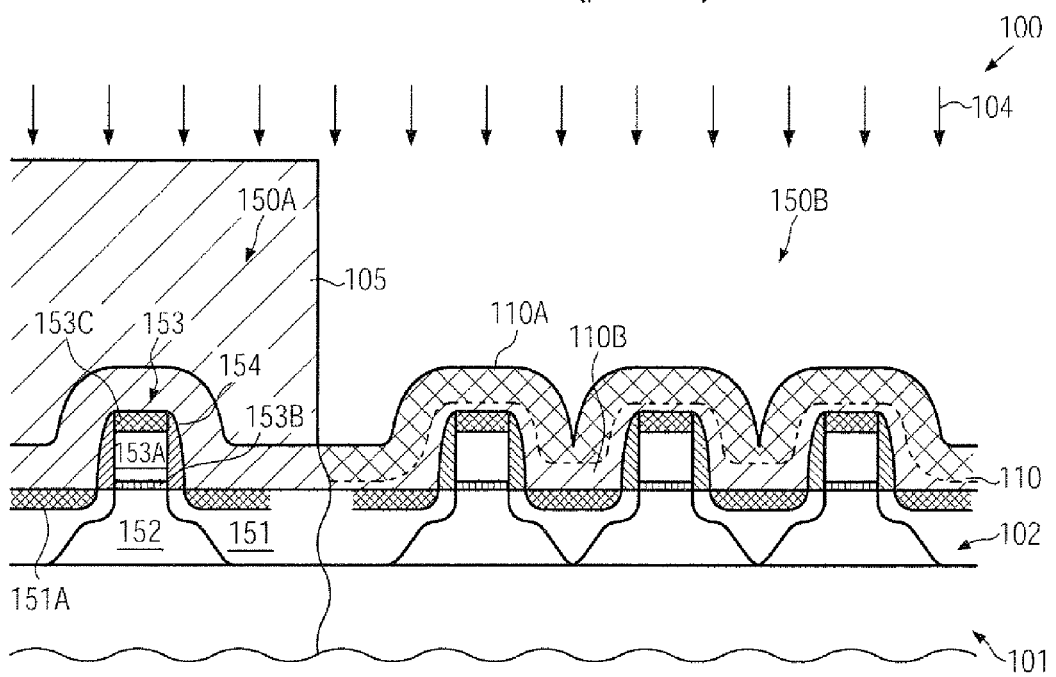

The layer 210D may be formed on the basis of a second deposition process 212, which may be performed on the basis of substantially the same process parameters as previously described with reference to the deposition process 211. For example, if the total thickness of the layers 210C, 210D is to be selected so as to correspond to a thickness of the conventional layer 110, as shown in FIGS. 1a-1b, substantially the same cycle time may be accomplished during the deposition processes 211 and 212, in particular when the deposition 210D is followed by a further deposition process for forming an interlayer dielectric material which may be accomplished by appropriately changing the deposition parameters. In this case, the number of transport activities required for performing the implantation process 204 (FIG. 2b) between the deposition of the layers 210C, 210D may be substantially equal to the number of transport activities required in the conventional process flow, in which a respective transport activity may be required after the complete deposition of the layer 110 with a subsequent further deposition of the interlayer dielectric material. Furthermore, in some illustrative embodiments, the overall cycle time may be reduced since a reduced dose during the implantation process 204 may be sufficient due to the reduced layer thickness and the improved overall surface conditions, while nevertheless providing an enhanced degree of stress relaxation.

Figure 2D:
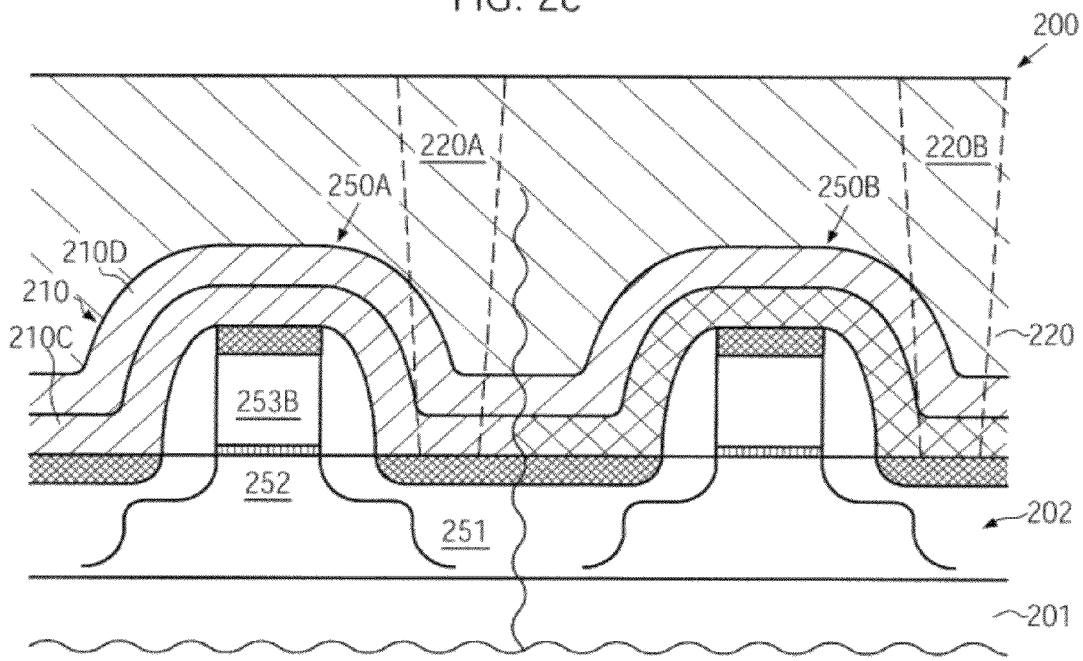

FIG. 2d schematically illustrates the semiconductor device 200 in a further advanced manufacturing stage in which an interlayer dielectric material 220, for instance in the form of silicon dioxide and the like, is formed above the first and second transistors 250A, 250B. In one illustrative embodiment, as shown, the interlayer dielectric material 220 may be formed on the second dielectric layer 210D, thereby providing superior overall process efficiency with comparable or even reduced overall cycle time compared to conventional strategies. The interlayer dielectric material 220 may be deposited on the basis of well-established deposition regimes, such as PECVD using TEOS as a precursor material and/or on the basis of a thermally activated chemical vapor deposition process, depending on the overall device requirements. After the deposition of the interlayer dielectric material 220, the surface topography thereof may be planarized, for instance by chemical mechanical polishing (CMP) and the like. Thereafter, contact openings 220A, 220B, indicated as dashed lines, may be formed by using well-established patterning regimes, wherein the combined layers 210C, 210D may be used as efficient etch stop materials.

Figure 2E:
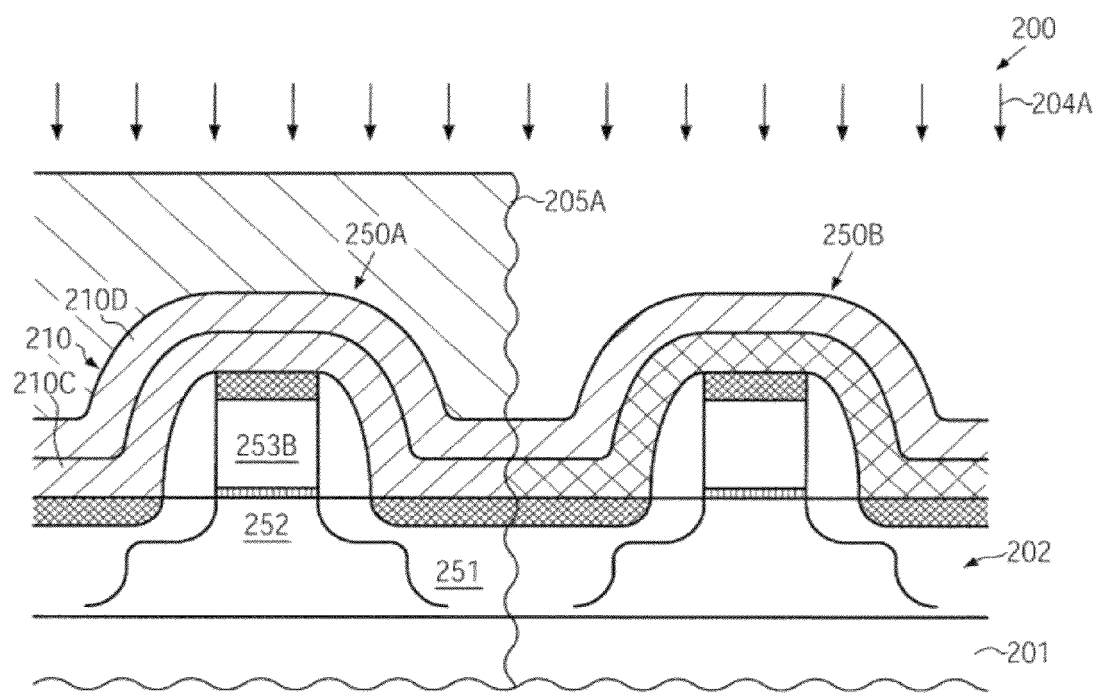
FIG. 2e schematically illustrates a cross-sectional view of the semiconductor device according to still further illustrative embodiments in which a second stress relaxation process may be performed after carrying out the second deposition step, according to further illustrative embodiments.

FIG. 2e schematically illustrates the semiconductor device 200 according to further illustrative embodiments in which, after the deposition of the layer 210D, a further implantation process 204A may be performed on the basis of an implantation mask 205A in order to also relax the exposed portion of the layer 210D, thereby further reducing the overall stress component of dielectric material positioned above the transistor 250B. In this case, the selection of the process parameters of the process 204A may be less critical, even if a pronounced surface topography may be generated after the deposition of the layer 210D, since generally a reduced thickness is to be relaxed and also any substantially stressed layer portions may only have a reduced effect on the performance of the transistor 250B due to the presence of the substantially relaxed portion 210A.

In other illustrative embodiments, the thickness of the layers 210C, 210D may be selected moderately thin so as to enhance the overall efficiency of the respective implantation processes 204, 204A, wherein one or more further deposition steps may be performed in order to obtain the finally desired total thickness of highly stressed dielectric material above the transistor 250A, while sequentially providing efficiently relaxed portions above the transistor 250B. Thereafter, the further processing may be continued as previously described, i.e., the interlayer dielectric material 220 may be deposited, which in the embodiment shown may now be formed on the layer 210D having a highly stressed portion above the transistor 250A and a substantially relaxed portion above the transistor 250B. In other cases, when a further stressed dielectric material is to be deposited on the second dielectric layer 210D, any further relaxation implantations may be omitted due to the very efficient relaxation obtained by the processes 204, 204A and thus a similar configuration may be obtained as is shown in FIG. 2d, in which the interlayer dielectric material 220 may be formed on a highly stressed dielectric material above the first and second transistors 250A, 250B.

Figure 2F:
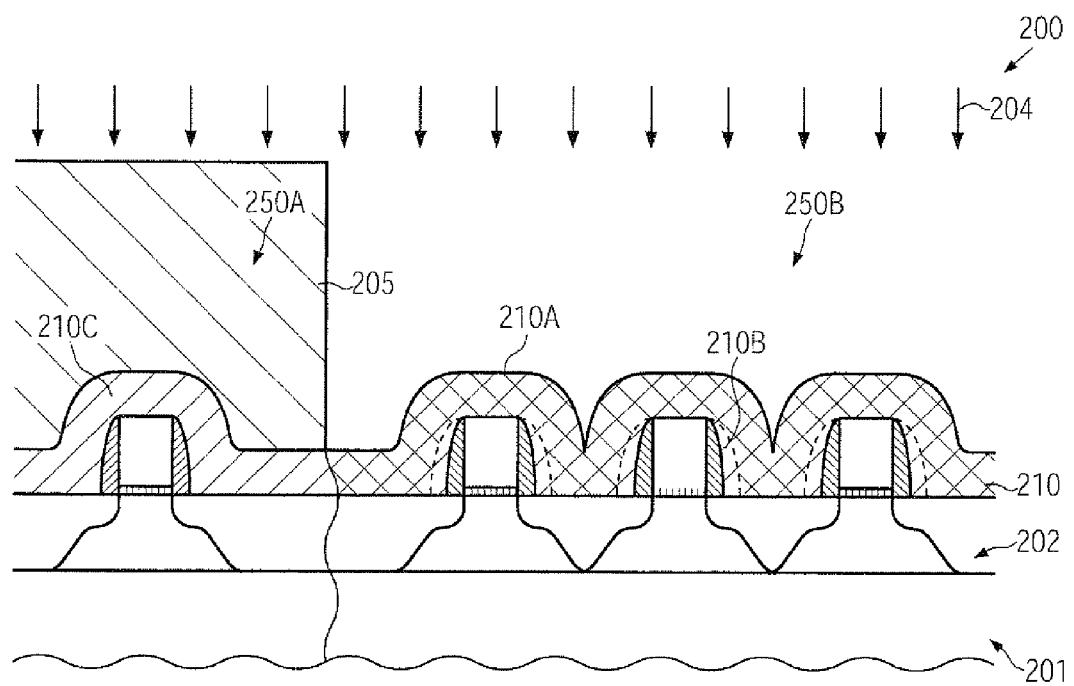
FIGS. 2f-2g schematically illustrate cross-sectional views of the semiconductor device including a densely packed device region above which enhanced stress relaxation may be achieved after a first deposition step on the basis of a tilted relaxation implantation process, according to still further illustrative embodiments.

FIG. 2f schematically illustrates the semiconductor device 200 according to further illustrative embodiments in which a plurality of transistors 250B may be provided in a densely packed device region, i.e., in a device region in which a lateral distance between neighboring gate electrode structures may be comparable with the length dimensions of the respective transistors 250B. For instance, the distance between neighboring gate electrode structures 253 may be approximately 200 nm and less for highly scaled transistor elements. As shown, the first dielectric layer 210C may be formed above the first transistor 250A and the plurality of second transistors 250B with an appropriate thickness so as to maintain respective thickness variations in the densely packed device region at a moderately low level, in order to enhance the efficiency of the relaxation implantation process 204, as previously described. For example, a thickness of approximately 50 nm and less for the first dielectric layer 210C may be used. As illustrated, although an enhanced relaxation effect may be accomplished above substantially horizontal device portions, nevertheless at sidewall portions of the gate electrode structures 253, which may or may not include the spacer structure 254, respective non-relaxed portions 210B may still be present. In some illustrative embodiments, the size of these portions 210B may be significantly reduced by appropriately selecting the process conditions of the implantation process 204.

Figure 2G:
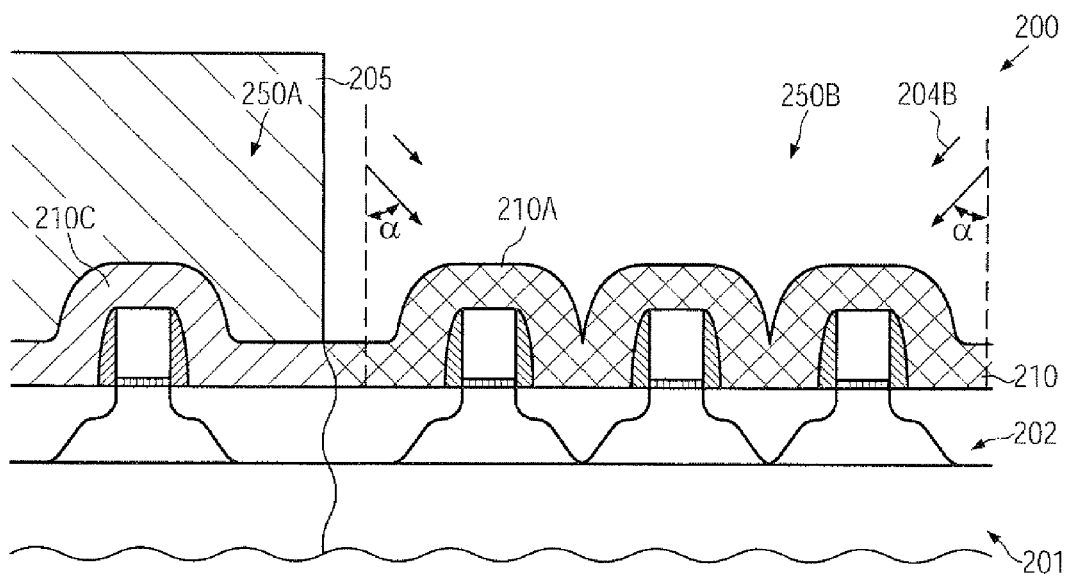

FIG. 2g schematically illustrates the device 200 according to illustrative embodiments in which the effective thickness of substantially vertical areas of the layer 210C may be "reduced" by using a tilt angle during the implantation process 204. That is, as shown, a tilt angle of $\alpha$ and $-\alpha$ may be used during a certain phase of the implantation process 204, thereby "increasing" the average penetration depth for a given implant energy. It should be appreciated that a tilt angle has to be understood as the angle defined by an incoming ion beam 204B, which typically has a moderately low divergence and a direction substantially perpendicular to a reference plane, for instance the semiconductor layer 202, wherein a tilt angle of zero is to be understood as a direction that substantially corresponds to the surface normal of the layer 202. Hence, by using appropriate tilt angles, for instance in the range of approximately 10-50 degrees, an enhanced relaxation effect may be obtained so as to further reduce the size of the portions 210B. In some illustrative embodiments, the implantation energy may even be increased during a tilted implantation step substantially without causing undue damage of the underlying transistor structure since, during a respective tilted implantation step, the effective thickness of substantially horizontal portions of the layer 210C may also be increased corresponding to the cosine of the tilt angle α.

Thereafter, the further processing may be continued, as previously described, for instance, by depositing the layer 210D and forming the dielectric material 220.

As a result, the present invention provides techniques and respective semiconductor devices in which a highly efficient strain transfer mechanism for one type of transistor may be provided, for instance for P-channel transistors or N-channel transistors, while a negative influence of the corresponding highly stressed dielectric material on the other type of transistors may be reduced on the basis of an implantation process which may be performed on the basis of a reduced layer thickness. Thereafter, a further deposition step may be performed in order to obtain the desired total thickness of the stressed dielectric material, wherein the previously relaxed portion may act as an efficient buffer material, while, in other cases, a further relaxation implantation process may be performed. Furthermore, the efficiency of the stress relaxation implantation process may further be enhanced in some illustrative embodiments by using a tilt angle.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first stress-inducing layer above a first transistor and a second transistor formed above a substrate, said first stress-inducing layer generating a first type of stress;
    reducing a magnitude of said first type of stress of said first stress-inducing layer above said second transistor;
    after reducing the magnitude of said first type of stress of said first stress-inducing layer, forming a second stress-inducing layer directly on said first-stress-inducing layer above said first and second transistors, said second stress-inducing layer generating said first type of stress, wherein said first and second stress-inducing layers comprise the same material and are formed using a deposition process having substantially the same process parameters; and
    reducing a magnitude of said first type of stress of said second stress-inducing layer above said second transistor.

2. The method of claim 1, wherein reducing said first type of stress comprises performing a particle bombardment above said second transistor while covering said first transistor and a portion of said first stress-inducing layer formed above said first transistor.

3. The method of claim 2, wherein performing said particle bombardment comprises performing said particle bombardment using a tilt angle.

4. The method of claim 1, further comprising forming a dielectric material on said second stress-inducing layer, said dielectric material having an internal stress level that is less than an internal stress level of said second stress-inducing layer.

5. The method of claim 1, further comprising forming a dielectric material on said second stress-inducing layer, said dielectric material having an internal stress level that is less than an internal stress level of a non-relaxed portion of said second stress-inducing layer.

6. The method of claim 1, further comprising forming metal silicide regions in drain and source regions of said first and second transistors and forming said first stress-inducing layer on said metal silicide regions.

7. The method of claim 1, wherein said first and second stress-inducing layers generate a compressive strain in a channel region of said first transistor.

8. The method of claim 7, wherein a thickness of said first stress-inducing layer is approximately 50 nm or less.

9. The method of claim 8, wherein a thickness of said second stress-inducing layer is approximately 50 nm or less.

10. The method of claim 1, wherein said first and second stress-inducing layers generate a tensile strain in a channel region of said first transistor.

11. The method of claim 1, wherein at least one of said first and second stress-inducing layers comprises silicon and nitrogen.

12. The method of claim 1, wherein at least one of said first and second stress-inducing layers comprise silicon and carbon.

13. The method of claim 1, wherein a gate length of at least one of said first and second transistors is approximately 50 nm of less.

* * * * *